United States Patent [19]
Saito

[11] Patent Number: 5,254,868
[45] Date of Patent: Oct. 19, 1993

[54] SOLIDSTATE IMAGE SENSOR DEVICE
[75] Inventor: Yutaka Saito, Tokyo, Japan
[73] Assignee: Seiko Instruments Inc., Japan
[21] Appl. No.: 734,262
[22] Filed: Jul. 22, 1991
[30] Foreign Application Priority Data Jul. 25, 1990 [JP] Japan .................. 2-196462

[51] Int. Cl.⁵ .................. H01L 27/14; H01L 31/00
[52] U.S. Cl. .................. 257/432; 257/444; 257/446; 257/448; 257/774
[58] Field of Search .......... 357/30 R, 30 D, 30 G, 357/30 H, 30 I, 30 M, 30 P, 30 Q; 250/211 J, 211 R; 257/444, 446, 448, 774, 432

[56] References Cited
U.S. PATENT DOCUMENTS

| | | | |
|---|---|---|---|
| 4,255,212 | 3/1981 | Chappell et al. | 357/30 J |
| 4,547,792 | 10/1985 | Sclar | 357/30 D |
| 4,612,408 | 9/1986 | Moddel et al. | 357/30 D |
| 4,783,691 | 11/1988 | Harada | 357/30 Q |
| 4,845,375 | 7/1989 | Tsushima | 357/30 I |
| 4,956,687 | 9/1990 | Bruin et al. | 357/30 H |

Primary Examiner—Rolf Hille
Assistant Examiner—Minhloan Tran
Attorney, Agent, or Firm—Bruce L. Adams; Van C. Wilks

[57] ABSTRACT

In a semiconductor image sensor device comprising arrayed photo-sensors, a connection electrode used for connecting an external circuit or an aperture on the connection electrode is provided at an opposite side surface to an illuminated surface, and a transparent substrate is provided above the arrayed photo-sensors, whereby the distance between a light source and the photo-sensors can be reduced so as to improve sensitivity and resolving power.

34 Claims, 10 Drawing Sheets

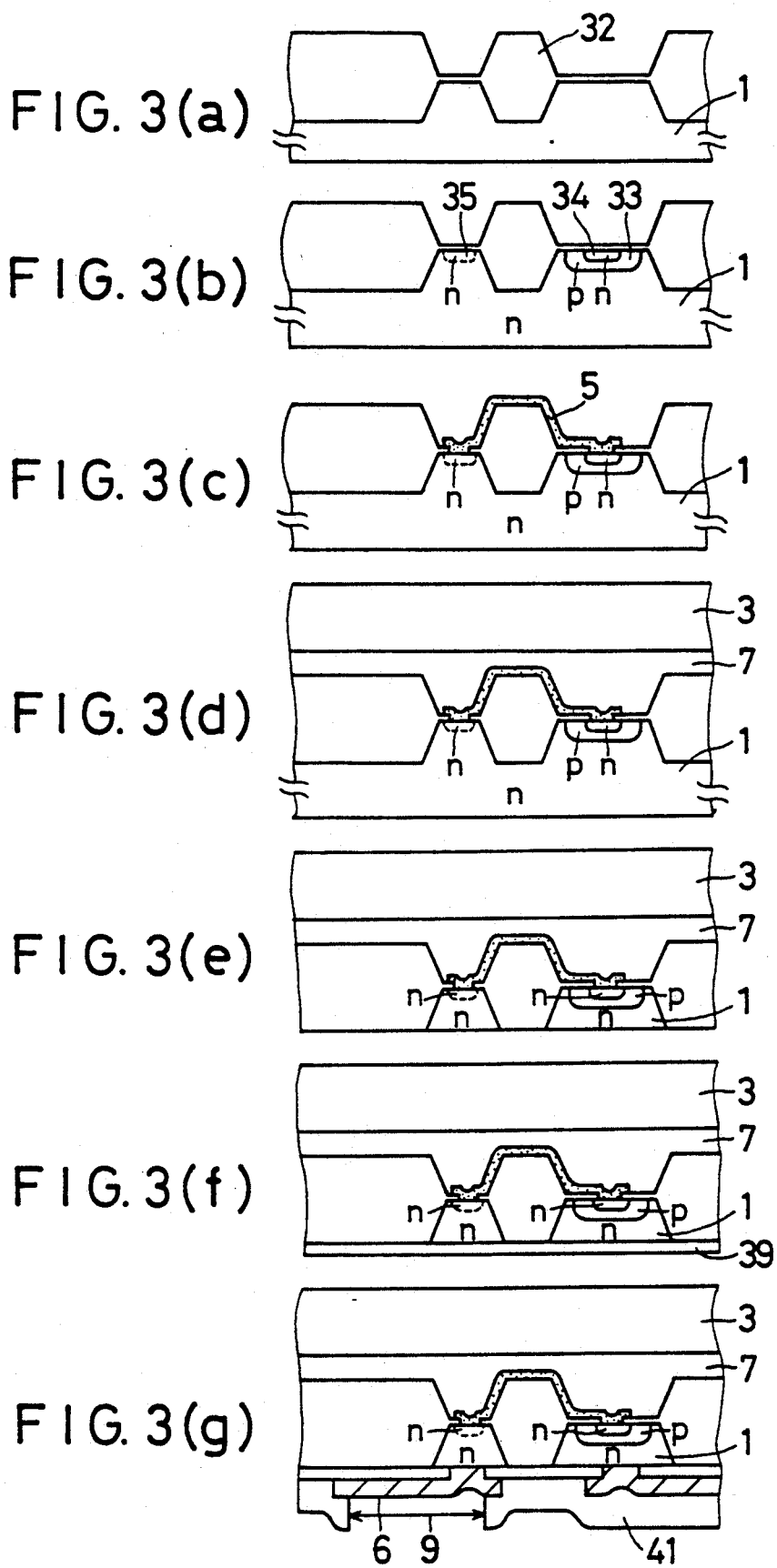

SOLIDSTATE IMAGE SENSOR DEVICE

BACKGROUND OF THE INVENTION

The present invention relates to semiconductor image sensor devices which convert light into electric signals.

A cross-sectional view of a conventional semiconductor image sensor device is shown in FIGS. 15 and 16.

Electrodes for taking out the output of photo-transistors and circuits for driving the photo-transistors and reading out output thereof are provided on the same surface as that on which the arrayed photo-transistors is provided, and an electrode used for connecting an external circuit is provided on a illuminated surface side.

The above described structure of the conventional image sensor has the following drawbacks. Since the electrode and the wire used in wire bonding method and the like for connecting a circuit of a readout substrate to an external circuit passes above the illuminated surface side of the photo-transistor, a distance between the photo transistor and light source cannot be shortened less than a certain degree when the image sensor is mounted on the readout substrate. Further, in case the driving or readout circuits are built in the image sensor device the circuits are subjected to the influence of light. Moreover, since the electrode or the circuits for taking out the output is provided on the same substrate, aperture ratio of pixels cannot be increased.

SUMMARY OF THE INVENTION

In order to solve the above noted problems, the invention employs a transparent substrate bonded to the semiconductor substrate with substrate bonding technology so as to enable one to take out the output signals from the opposite surface side to the illuminated surface side.

By employing the above noted technology, the electrode or the wire for connecting the output or the internal circuit of the semiconductor image sensor to the external circuit are provided on the opposite side to the illuminated surface side. Further, the internal circuit may be formed on the opposite side to the illuminated surface side, and the aperture ratio of the pixels increases.

BRIEF DESCRIPTION OF THE DRAWINGS

FIGS. 3(a)-3(g) are sequential cross-sectional views showing the steps for forming a semiconductor image sensor device according to the second embodiment of the invention.

DETAILED DESCRIPTION OF THE INVENTION

Hereinafter, the invention will be described in detail with reference to the drawings.

Figure 1:
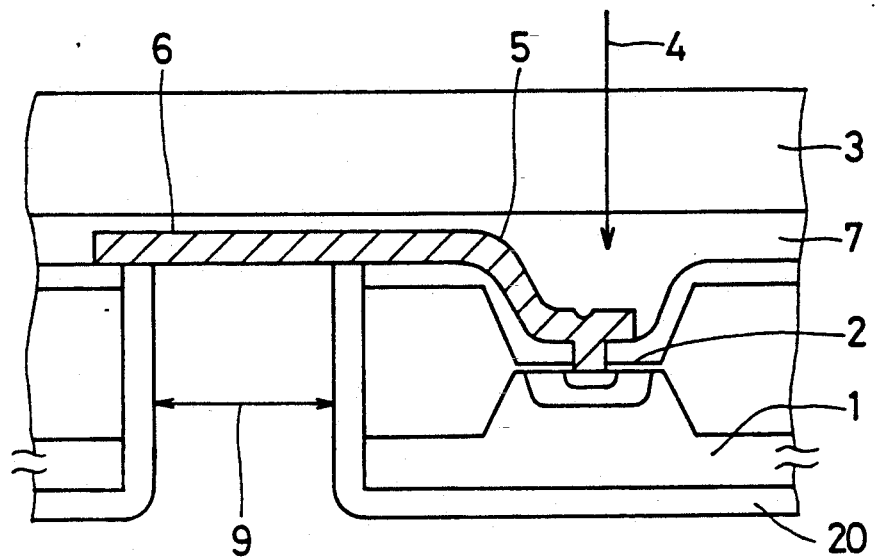
FIG. 1 is a cross-sectional view of a semiconductor image sensor device according to the first embodiment of the invention.

FIG. 1 is a cross-sectional view of a semiconductor image sensor device according to the first embodiment of the invention. In FIG. 1, the upper surface of the drawing is the illuminated surface. A photo-transistor 2 receives incident light 4 through a transparent substrate 3 and outputs an electric signal. This output signal is introduced into a connection electrode 6 used for connecting an external circuit through an electrode 5 for taking out output of the photo-transistor, and then is given to the external circuit from the opposite side to the illuminated surface side of the image sensor device through a wire bonded to the connection electrode in the aperture 9.

Figure 2:
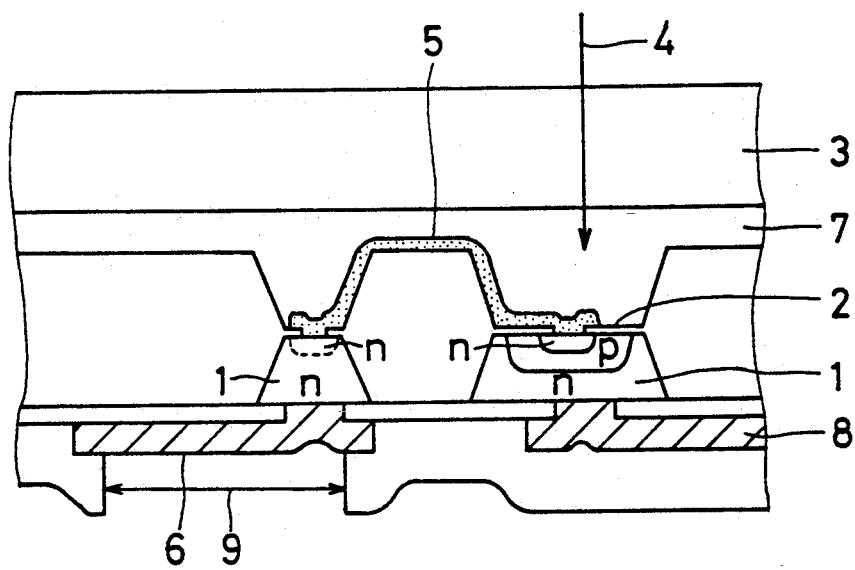
FIG. 2 is a cross-sectional view of a semiconductor image sensor device according to the second embodiments of the invention.

FIG. 2 is a cross-sectional view of the semiconductor image sensor device according to the second embodiment of the invention. In FIG. 2, the photo-transistor 2 receives incident light 4 and outputs the electric signal. This output signal is introduced to the opposite side to the surface illuminated by the incident light 4 through the electrode 5 for taking out the output of the photo-transistor and the semiconductor substrate 1, and then is taken out into the external circuit through the connection electrode 6. In this embodiment, since the connection electrode 6 is formed on the opposite surface side to the illuminated surface side, the method for forming the a is similar to the method for forming that of the ordinary semiconductor integrated circuit. Therefore, this embodiment is very practical and easy to adopt.

FIGS. 3(a)-(g) are cross-sectional views of the semiconductor image sensor device showing process steps used to produce an image sensor device according to the second embodiment. First, in FIG. 3(a) step, a device isolation oxide film (LOCOS) 32 is formed on an N conductivity type silicon substrate 1.

Next, in FIG. 3(b) step, P type impurity is introduced by ion implantation, or by impurity vapor diffusion method in which vaporized gas such as BBr₃ is decomposed thermally and diffused into the silicon substrate 1 in an inert gas atmosphere at 900°–950° C., and then thermal treatment is carried out so as to form a P conductivity type base region 33. Successively, N type impurity is introduced by ion implantation, or by impurity vapor diffusion method in which vaporized gas such as POCl₃ and P₂O₅ is decomposed thermally and diffused into the base region 33 in an inert gas atmosphere at 900°–950° C., and then thermal treatment is carried out so as to form an N conductivity type emitter region 34. Concurrently, an N conductivity type diffusion layer region 35 for giving the output of the photo-transistor 2 to the opposite side to the illuminated surface side through the substrate is formed. In FIG. 3(c) step after opening a contact hole, polysilicon 5 is formed as an electrode for taking out the output of the photo-transistor. In FIG. 3(d) step, a transparent substrate 3 is bonded to the substrate 1 by a transparent adhesive 7. In FIG. 3(e) step, the opposite surface to the illuminated surface is polished so that each region of the substrate is isolated by LOCOS. Then, in FIG. 3(f) step, an insulating film 39 is formed. Lastly, in FIG. 3(g) step, a connection electrode 6 for the external circuit, a protection layer 41 and an aperture 9 are formed on the lower surface.

Figure 4A:
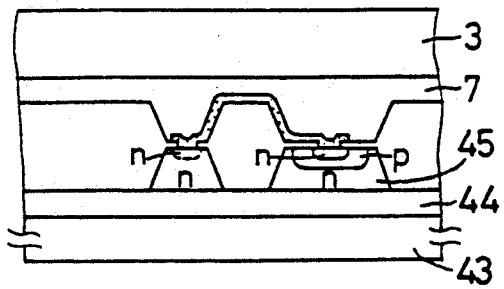
FIGS. 4(a)-4(c) are sequential cross-sectional views showing the steps for forming a semiconductor image sensor device according to the third embodiment of the invention.
Figure 4B:
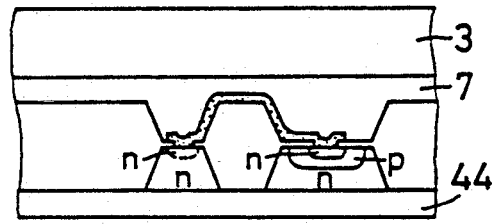
Figure 4C:
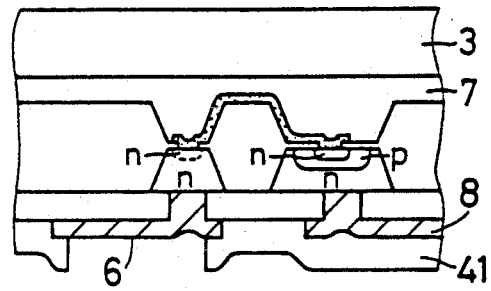

FIGS. 4(a)–(c) are cross-sectional views showing steps for producing a semiconductor image sensor device according to the third embodiment of the invention. This embodiment shows an example to use a so-called SOI substrate wherein an insulator (oxide film) 44 and a second semiconductor substrate 1 are successively superposed on a first semiconductor substrate 43.

In FIG. 4(a) step, a LOCOS oxide film, a photo-transistor and an electrode for taking out output of the photo-transistor are formed and a transparent substrate 3 is bonded to the upper surface of the second semiconductor substrate 45 in a similar manner to the second embodiment. In FIG. 4(b) step, the first semiconductor substrate 43 is removed. This removing step can be effected by polishing as in the second embodiment or by etching taking advantage of a difference in etching rate between the semiconductor substrate 43 and the insulator 44. Since the photo-transistors are isolated from each other at the time of the formation of the LOCOS in this embodiment, there is no need to control the amount of the semiconductor substrate 1 to be removed. In FIG. 4(c) step, a connection electrode 6 for an external circuit and a protection film 41 are formed on the opposite side to the illuminated surface side.

Figure 5A:
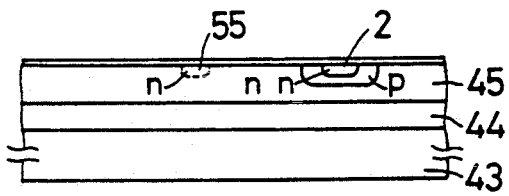
FIGS. 5(a)-5(d) are sequential cross-sectional views showing the steps for forming a semiconductor image sensor device according to the fourth embodiment of the invention.
Figure 5B:
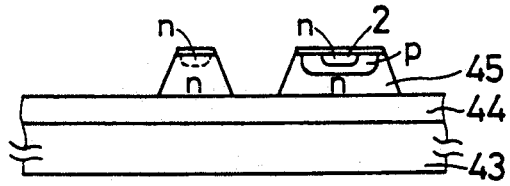
Figure 5C:
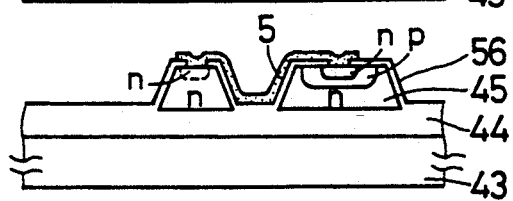
Figure 5D:
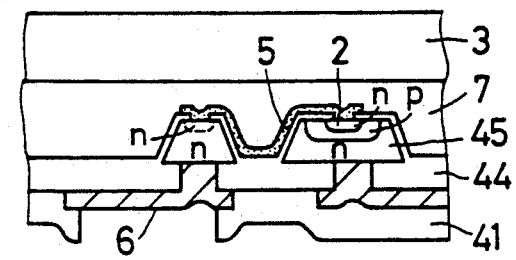

FIGS. 5(a)–(d) are cross-sectional views showing steps for producing a semiconductor image sensor device according to the fourth embodiment. Same as the third embodiment, this embodiment is an example to use a SOI substrate wherein an insulator (oxide film) 44 and a second semiconductor substrate 1 are successively superposed on a first semiconductor substrate 43. In FIG. 5(a) step, a photo-transistor 2 and an impurity diffusion region 55 used for connecting an electrode for taking out output of the photo-transistor are formed on the second semiconductor substrate 45. Next, in FIG. 5(b) step, the second semiconductor substrate 45 except the photo-transistor 2 and the impurity diffusion region 55 is removed by photolithography process and etching process so as to isolate each of the arrayed photo-transistors 2 and the impurity diffusion region 55. Isolation by removing parts of a substrate is called island isolation. In FIG. 5(c) step, after forming an insulating film 56 on each island, an electrode 5 for taking out output of the photo-transistor is formed. In FIG. 5(d) step, bonding of a transparent substrate 3, removing of the first semiconductor substrate 43 and forming of a connection electrode 6 for connecting the output of the photo-transistor to an external circuit and a protection film 41 are carried out in a similar manner to the third embodiment. Thus, by effecting island isolation as in this embodiment, the photo-transistor 2 may come closer to the light source in comparison with isolation by LOCOS.

Figure 6:
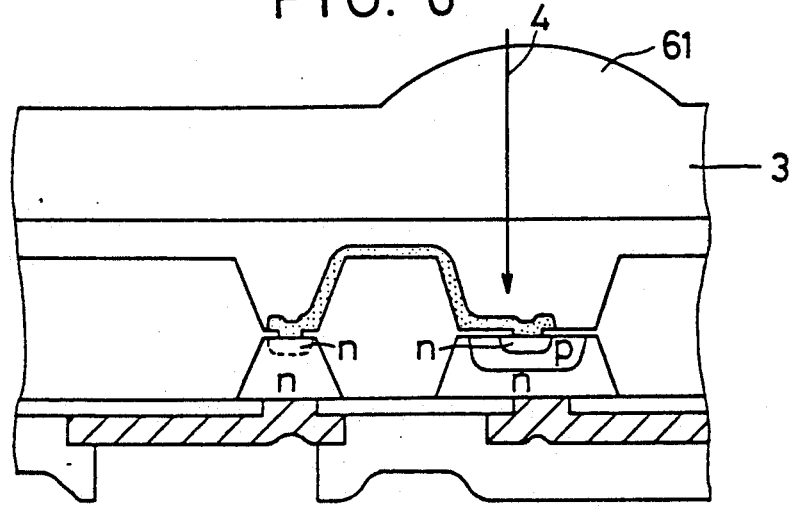
FIG. 6 is a cross-sectional view of a semiconductor image sensor device according to the fifth embodiment of the invention.

FIG. 6 is a cross-sectional view of a semiconductor image sensor according to the fifth embodiment of the invention. In this embodiment, a transparent substrate 3 bonded to an illuminated surface has a lens 61 corresponding to each of arrayed photo-transistors. This so called on-chip microlens focuses incident light, and therefore a semiconductor image sensor with high sensitivity can be realized.

Figure 7:
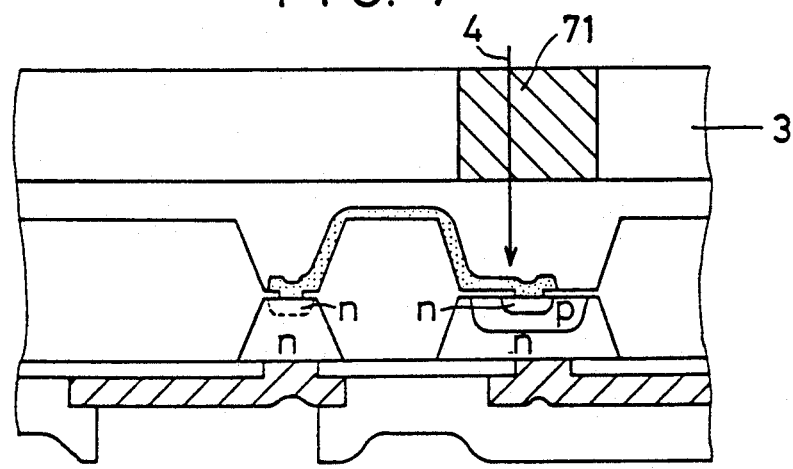
FIG. 7 is a cross-sectional view of a semiconductor image sensor device according to the sixth the invention.

FIG. 7 is a cross-sectional view of a semiconductor image sensor device according to the fifth embodiment of the invention. In this embodiment, a transparent substrate 3 bonded to an illuminated surface side of the semiconductor substrate has a Graded Index type optical fiber 71 corresponding to each of arrayed photo-transistors. Since this so-called fiber array plate focuses incident light on the photo-transistor, the same effect can be expected as the light source gets closer.

Figure 8:
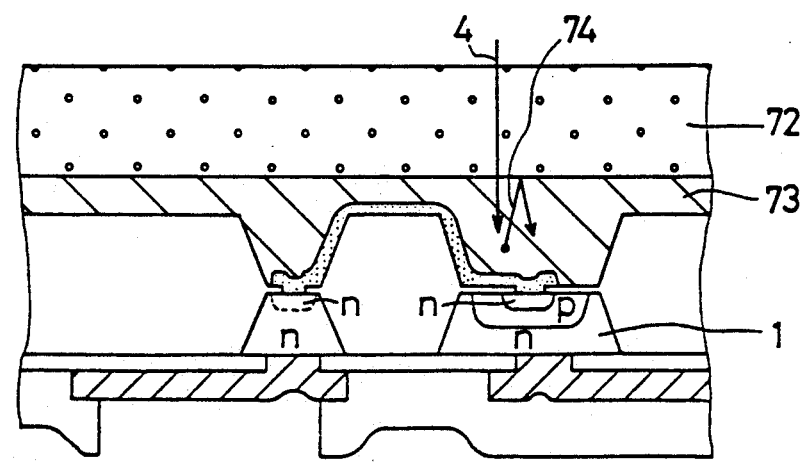
FIG. 8 is a cross-sectional view of a semiconductor image sensor device according to the seventh embodiment of the invention.

FIG. 8 is a cross-sectional view of a semiconductor image sensor device according to the seventh embodiment. This embodiment is an example to use an adhesive with a fluorescent substance 73 which enables detection of X-ray since the fluorescent substance radiates light by X-ray. If fluorescent substance such as Gd₂O₂:Tb are formed by sedimentation method, bonding of the substrate 72 may be carried out during the formation process. Alternately, after forming a fluorescent film of ZnWO₄, CsI:Tl and so on by evaporation method or sputtering, the substrate 72 may be bonded through an adhesive. Thus, according to this embodiment, it becomes possible not only to detect fluorescence generated by X ray but also to protect fluorescent substance or fluorescent film against the external environment. Further, in this embodiment, the substrate 72 does not necessarily have to be a transparent substrate, a substrate comprising Si wafer, or metals such as beryllium, which let X ray passes through but has high reflectivity against visible light, can be used. By utilizing such substrate, fluorescence generated by X ray which goes upward is reflected by the substrate 72 and cannot escape. Therefore, very effective detection can be realized.

Figure 9:
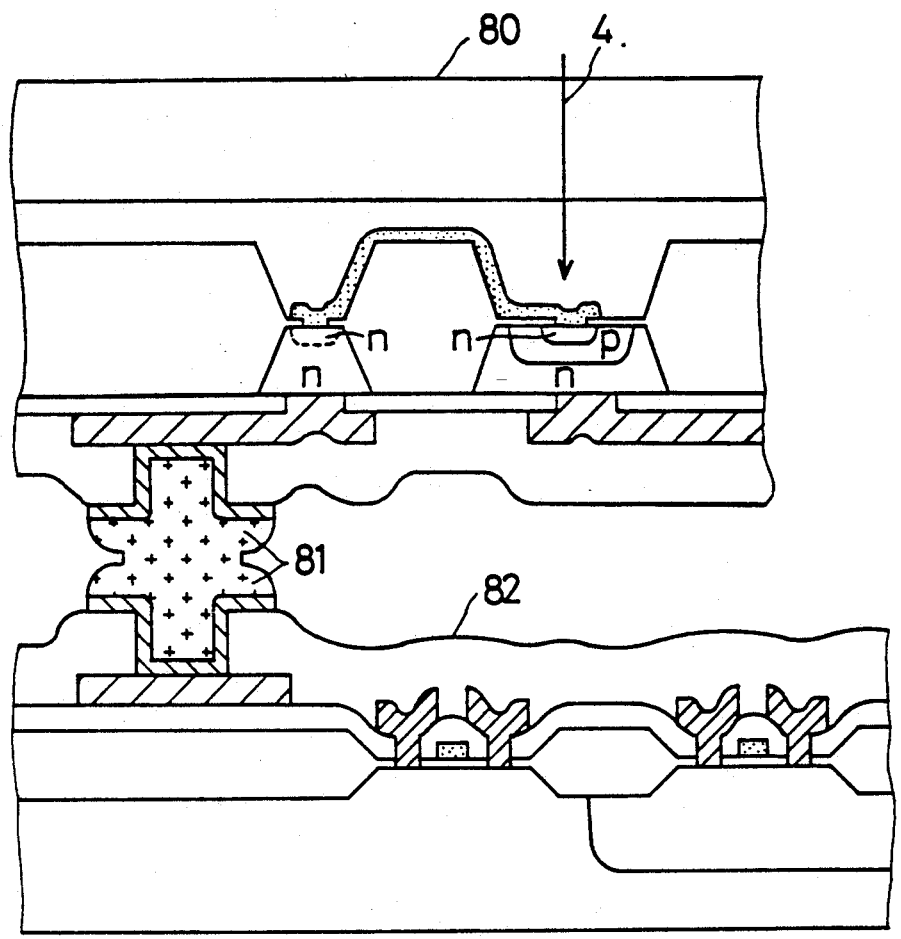
FIG. 9 is a cross-sectional view of a semiconductor image sensor device according to the eighth embodiment of the invention.

FIG. 9 is a cross-sectional view of a semiconductor image sensor device and a semiconductor integrated circuit for processing signals connected to each other through a bump electrode according to the eighth embodiment of the invention. As shown in the drawing, an inventive semiconductor image sensor device 80 is connected to a semiconductor integrated circuit 82 for processing signals through a bump electrode 81 so that signals can be processed on the opposite side to the illuminated surface side. A pair of each photo-transistor and its corresponding electrodes for taking out output of the photo-transistor is called a pixel, and a signal from each pixel can be processed separately. In an area type image sensor device wherein pixels are arrayed in a two-dimensional way, the signals of X-Y are read out by stage and read monitoring when signals are transferred by either frame transfer or random access. It is impossible to observe time dependence of image information which is picked up by each pixel unless the signal from the output electrode of each pixels is read out separately. Since multi-layer wiring is needed or a large aperture ratio is not obtained when the number of the pixels is large in the prior art, it is impossible to observe the time dependence of image information. However, according to this embodiment, it becomes easy to observe time dependence of image information by using semiconductor integrated circuit with a time dependence memory function (i.e. so called analogue memory). Such a device that can detect and process the signal from each pixel separately is called a pad device.

Figure 10:
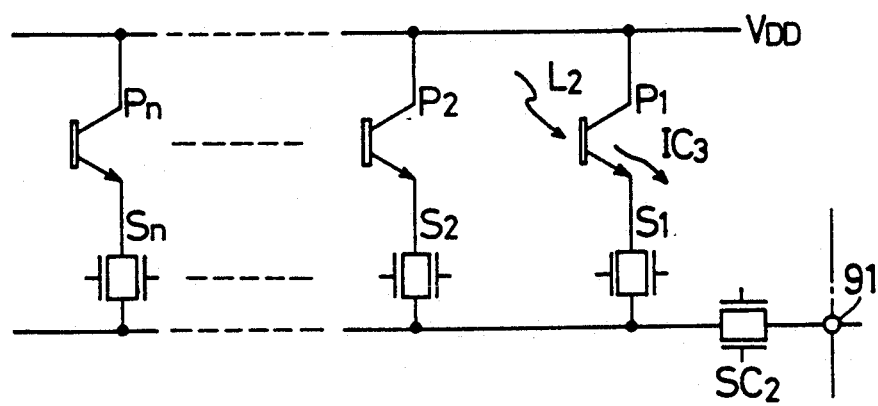
FIG. 10 is a schematic circuit of a semiconductor image sensor device with an internal circuit.

FIG. 10 is a schematic circuit of a semiconductor image sensor device with a internal MOS circuit to explain the ninth embodiment. In FIG. 10, output signals from $P_1$-$P_n$ are transferred to a connection electrode 91 used for connecting an external circuit through $S_1$-$S_n$ and SC2 in a time sharing manner.

Figure 16:
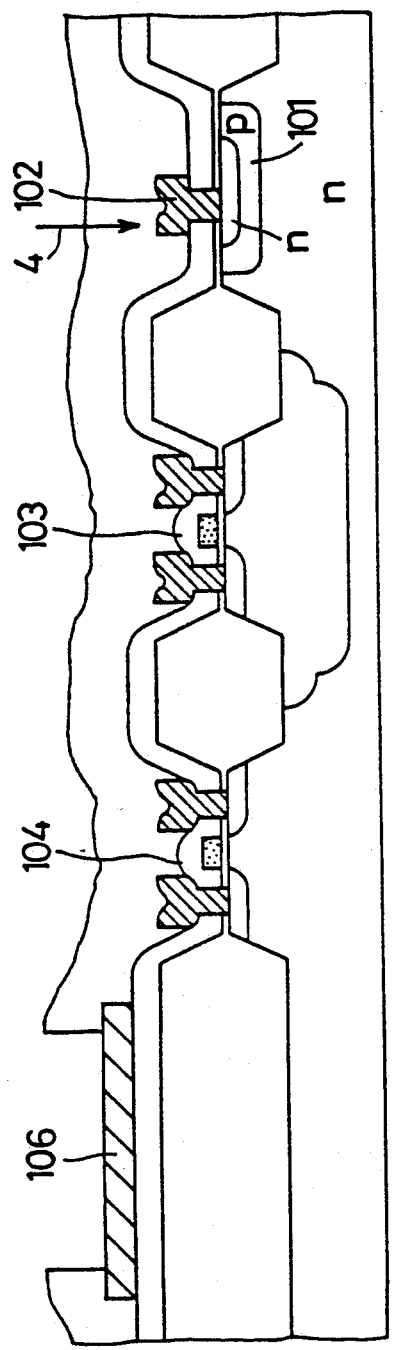
FIG. 16 is a circuit diagram of a conventional semiconductor image sensor device with an internally provided circuit.

FIG. 16 is a cross-sectional view of a conventional image sensor with an internal CMOS circuit shown to compare with the ninth embodiment of the invention. A photo-transistor 101, an N channel MOS transistor 103, a P channel MOS transistor 104 and a connection electrode 105 used for connecting an external circuit are provided on an illuminated surface side being wired in a complicated manner.

Figure 11:
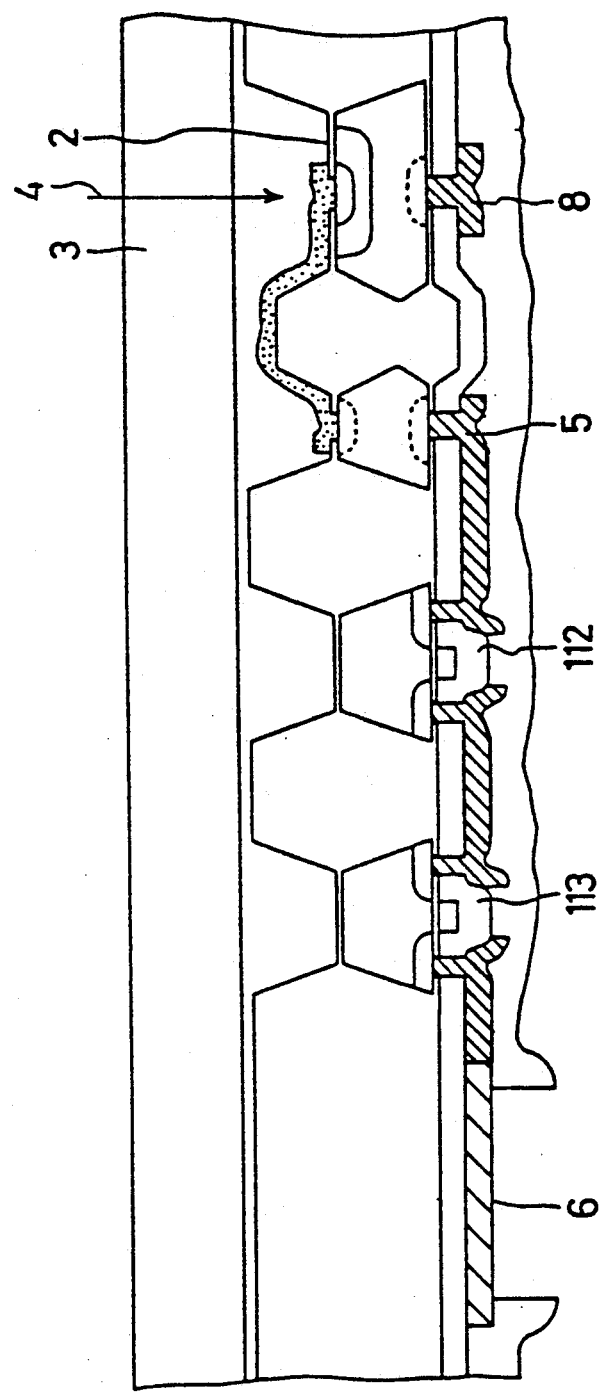
FIG. 11 is a cross-sectional view of a semiconductor image sensor device according to the ninth embodiment of the invention.

FIG. 11 is a cross-sectional view of a semiconductor image sensor device according to the ninth embodiment. Elements composing a circuit such as an N channel MOS transistor 112 and a P channel MOS transistor 113 are arrayed on an opposite side to an illuminated surface together with a connection electrode 6 used for connecting an external circuit. Since the elements are provided on the opposite side to the illuminated surface, the circuit is free from the influence of the incident light and functions stably.

Figure 12:
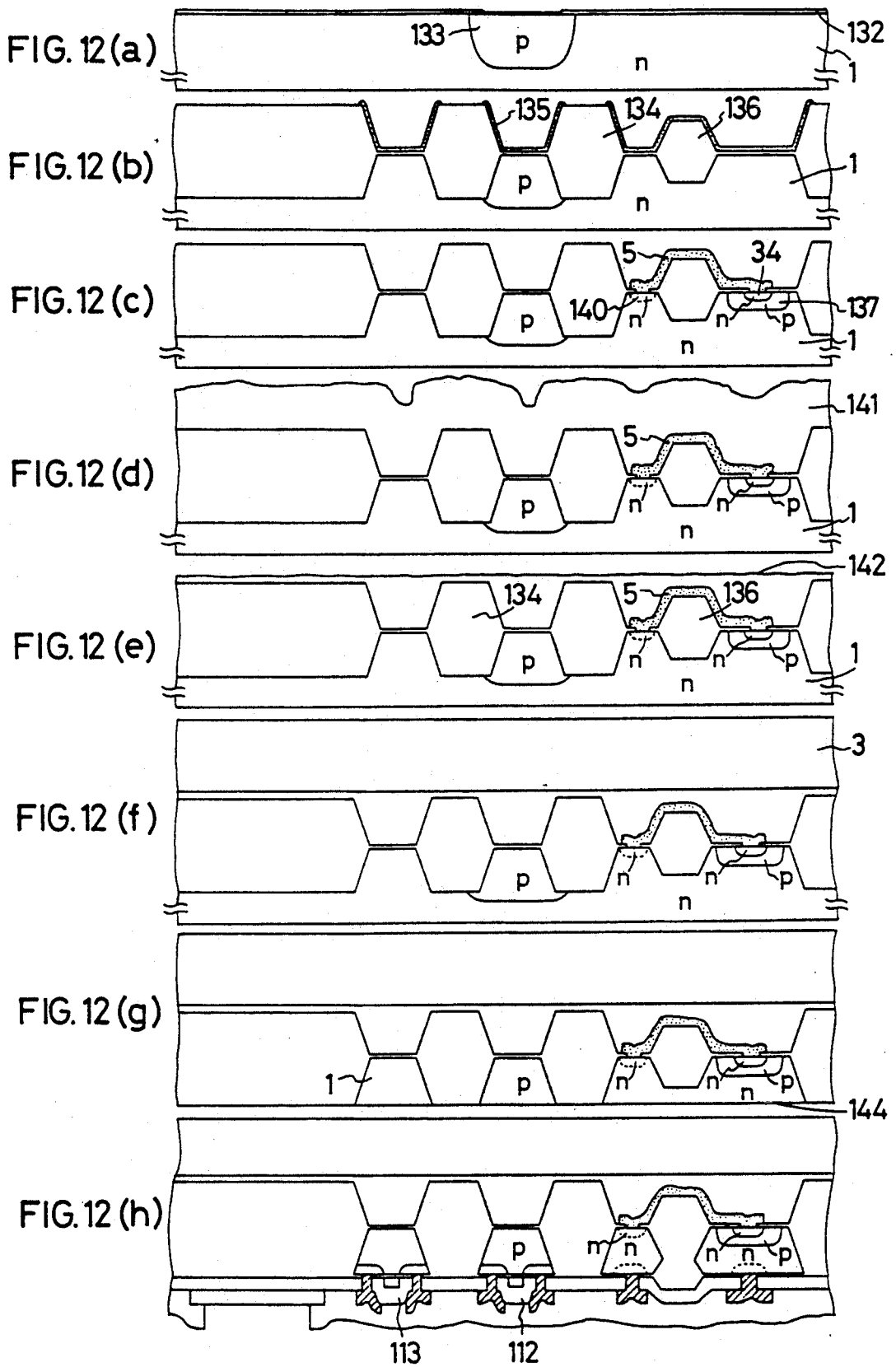
FIGS. 12(a)-12(h) are sequential cross-sectional views showing the steps for forming a semiconductor image sensor device according to the ninth embodiment of the invention.

FIGS. 12(a)-(h) are cross-sectional views showing the process steps according to the ninth embodiment. In FIG. 12(a) step, a P conductivity type well 133 is formed in a N conductivity type silicon substrate 1. Next, in FIG. 12(b) step, LOCOS $SiO_2$ 134 and 136 are formed. In FIG. 12(c) step, after a base region 137 of a photo-transistor and an N conductivity type polysilicon 5 is formed, thermal treatment is carried out to diffuse the N type impurity of the polysilicon 5 into the base region 137 thereby forming an emitter 34. Concurrently, an N type diffusion layer 140 for receiving the output of the photo-transistor and giving the output to the opposite side to the illuminated surface through the substrate is formed. The emitter 34 is formed by polysilicon emitter method in this embodiment. However, this step can be carried out by providing a contact hole and forming the electrode 5 for taking out the output after forming the emitter as in the previous embodiments. In FIG. 12 (d) step, insulator 141 such as NSG (Non-doped $SiO_2$) is deposited overall. In FIG. 12(e) step, a leveled face 142 is formed by etching or polishing. If a thick LOCOS 134 and a thin LOCOS 136 are formed, it becomes easier to polish the insulator 141 since the thick LOCOS serves as a stopper. In addition there is enough margin over the thin LOCOS so that the polysilicon 5 can easily be provided thereon. In FIG. 12(f) step, a transparent substrate 3 such as a quartz substrate is bonded by heating. In FIG. 12(g) step, the opposite surface of the silicon substrate to the illuminated surface is polished until the surface of the thick LOCOS is exposed so as to form a polished surface 144. In FIG. 12(h) step, in order to form a CMOS circuit on the silicon substrate, on N channel MOS transistor 112 and a P channel MOS transistor 113 are provided on the opposite surface by ordinal steps for forming the CMOS circuit.

Figure 13:
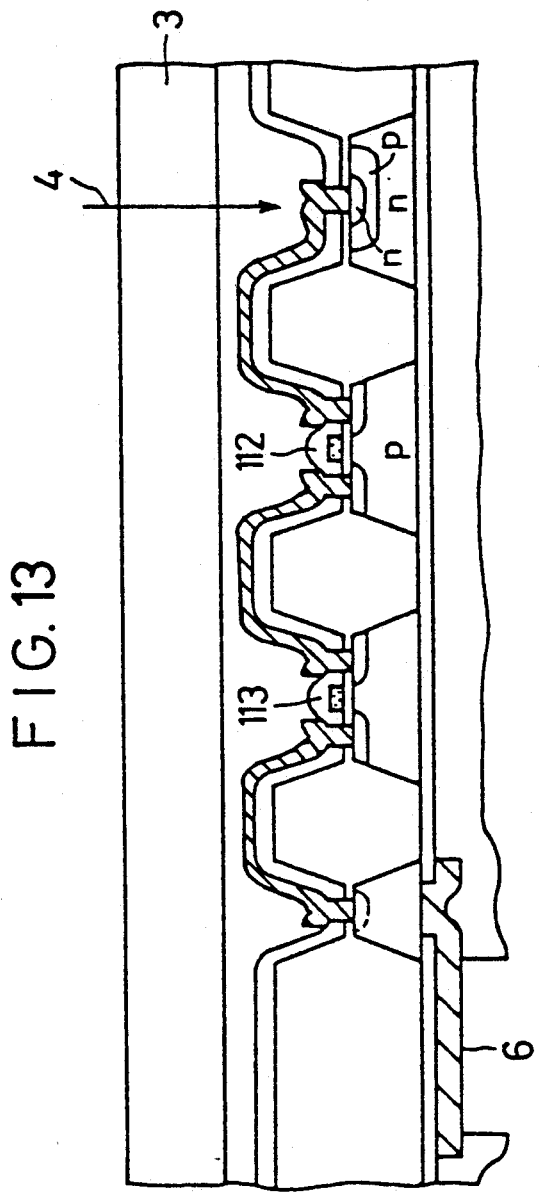
FIG. 13 is a cross-sectional view of a semiconductor image sensor device according to the tenth embodiment of the invention.

FIG. 13 is a cross-sectional view of a semiconductor image sensor device according to the tenth embodiment. Elements composing a circuit such as an N channel MOS transistor 112 and a P channel MOS transistor 113 are arrayed on the same illuminated surface side of the semiconductor substrate whereas a connection electrode 6 used for connecting an external circuit is provided on the opposite side to the illuminated surface side.

Figure 14:
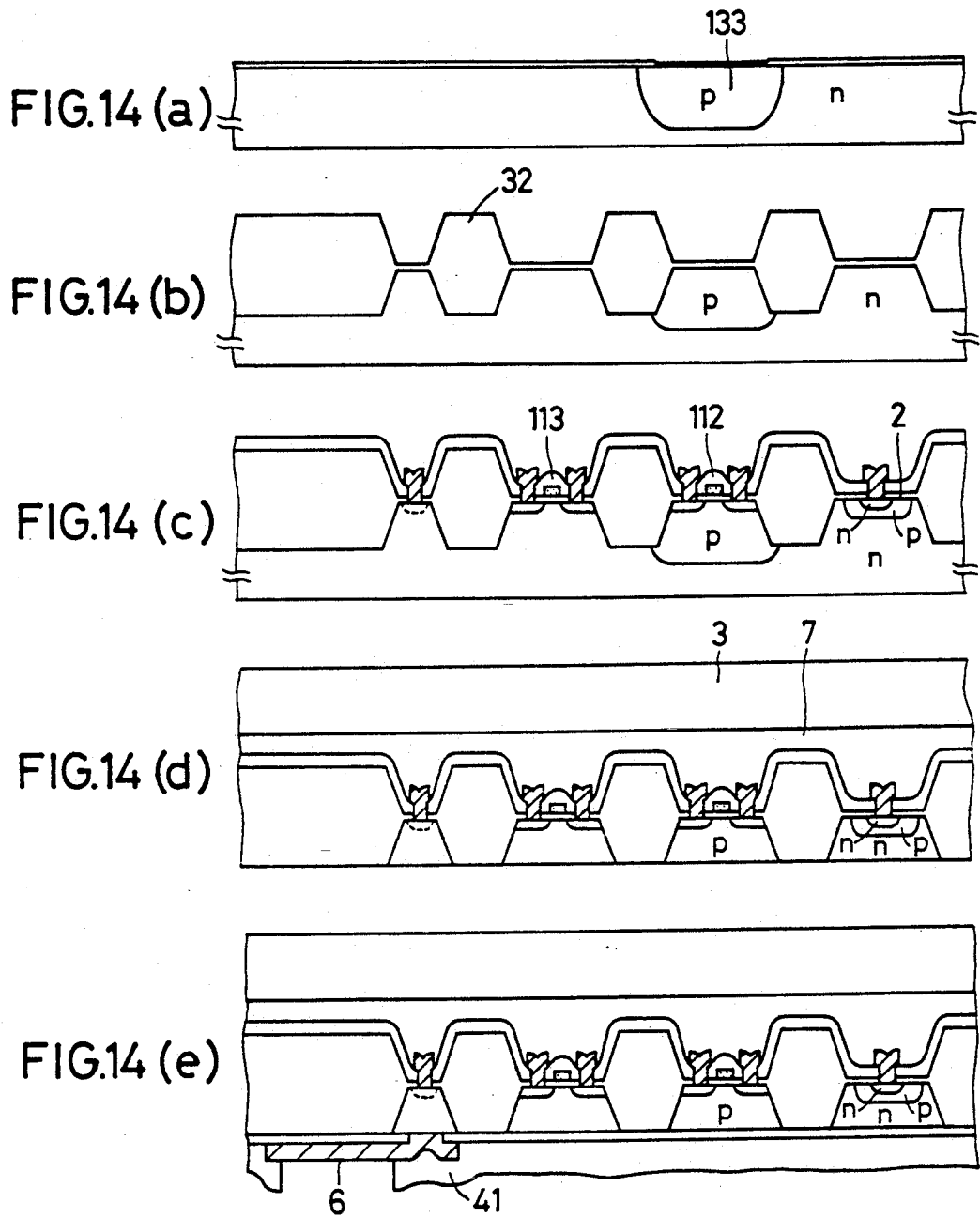
FIGS. 14(a)-14(e) are sequential cross-sectional views showing the steps for forming a semiconductor image sensor device according to the tenth embodiment of the invention.
Figure 15:
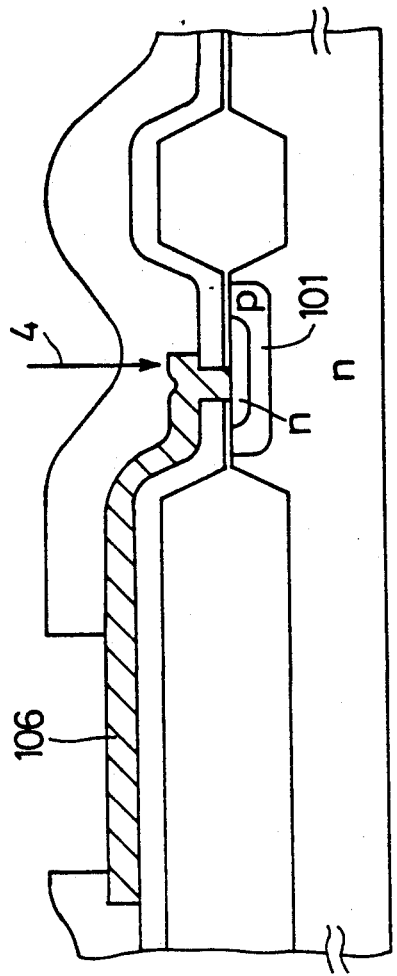
FIG. 15 is a cross sectional view of a conventional semiconductor image sensor device.

FIGS. 14 are cross-sectional views showing steps for producing a semiconductor image sensor according to the tenth embodiment. In FIG. 14(a) step, a well 133 is formed. In FIG. 14(b) step, a LOCOS 32 is formed. In FIG. 14(c) step, a photo-transistor 2, an N channel MOS transistor 112 and a P channel MOS transistor are formed on the same illuminated surface side of the semiconductor substrate. In FIG. 14(d) step, a transparent substrate 3 is bonded on the semiconductor substrate by an adhesive 7. In this embodiment, no thermal treatment is carried out in the following steps unlike in the ninth embodiment, so resin which has rather low thermal resistance may be used as the adhesive 7 as long as it is transparent. In FIG. 14(d) step, the opposite surface to the illuminated surface of the semiconductor substrate is polished as in the second embodiment. Lastly, in FIG. 14(e) step, a connection electrode 6 used for connecting an external circuit and a protection film 41 are formed on the opposite surface.

Thus, some embodiments according to the invention have been explained. Hereafter some common points to all the embodiments will be described.

Polysilicon is used as a material of the electrode for taking out the output of the photo-transistor in the embodiments. However, polycide, silicide and pure metal etc. may be utilized instead of polysilicon. As for the method for bonding the transparent substrate to the semiconductor substrate, the transparent substrate can be bonded to a leveled surface of such material as CVD $SiO_2$ and spin-on-glass by heating or it is possible to use low-melting glass or various resins such as silicon resin furoic resin,, epoxy resin, polyamide resin and organic UV hardened resin as an adhesive. The adhesive can be injected between the semiconductor substrate and the transparent substrate by vacuum injection method or it is available to utilize gel of solute by sedimentation method. As shown in some of the embodiments, a bias electrode of a collector of the photo-transistor is provided on the opposite side to the illuminated surface so as to increase the aperture ratio of the pixel and enable it easy to control a depletion layer width in the vertical direction. However, it is also possible to provide the bias electrode on the illuminated side and then transfer the bias to the other side through the substrate or to connect the bias electrode to the signal processing circuit.

In the embodiments, an image sensor device using an N type semiconductor substrate and an NPN type transistor are explained. However, a P type semiconductor substrate and a PNP type transistor may also be utilized.

In the embodiments, a sensor section is composed of a photo-transistor. However, a PN junction or MOS diode can also compose the sensor section. The PN junction is often better since response of the PN junction is faster than that of the photo-transistor in case of detecting radiation or charged particles.

In the above embodiments, an image sensor device using a photo-transistor is explained, the present invention is not restricted to a sensor device which detects only photons. The word "photo" here is used in a physical sense including electromagnetic wave and corpuscle such as infrared rays, radiant rays, X-rays, charged particles and neutrons. Especially when infrared rays, radiant rays and charged particles are detected, there are so many limitations to determine the thickness of the substrate, resistivity and the width of the depletion layer. However, in the present invention, since the thickness of the semiconductor substrate can be reduced to the desirable thickness after bonding the transparent substrate, it is easy to be controlled. If the object is only to control the thickness, it can also be achieved by polishing the semiconductor substrate after the transparent substrate is bonded to the semiconductor substrate and providing the aperture on the connection electrode used for connecting the external circuit on the side of the transparent substrate. In this case, either side of the image sensor device is available as an illuminated surface. It is recommended that the polished surface of the semiconductor substrate should be covered with a protection film of resin.

The following effects can be expected by using the present invention.

(1) Since electrodes and wires are provided on an opposite side to an illuminated surface, the distance between a light source and a substrate can be reduced so as to improve sensitivity and resolving power.

(2) Since output signal is taken out from the lower side of an image sensor device, the upper side of which is an illuminated side, a bump electrode can be formed so as to carry out mounting more freely.

(3) Since the upper surface of the photo-sensor is covered with the transparent substrate, there is no need to use potting material for protection as in conventional mounting.

(4) Since each of the arrayed photo-sensors is isolated by an insulator, carriers do not go into one photo-sensor from another so as to improve efficiency of the image sensor. These carries greatly influence the characteristics of the photo-sensors causing a problem at the time of efficiency test.

(5) Efficiency of the photo-sensor can be improved further by forming an on-chip-microlens on the upper surface of the transparent substrate which is formed on the upper surface of the photo-sensor or by using a fiber-array-plate built in the transparent substrate. Moreover, since the distance between the light source and the substrate is reduced, a conventional GRIN lens is not necessary for focusing an image on the photo-transistor thereby to reduce the number of the steps and cost drastically.

(6) Since the internal circuit is provided on the opposite side to the illuminated surface, the circuit is not influenced by the light very much and smooth circuit operation can be expected.

(7) Since the thickness of the first semiconductor substrate can be reduced to the desirable thickness, the thickness of the substrate and the width of the depletion layer which are needed in case of detecting radiant rays can be freely controlled.

(8) X-ray can be detected by providing a fluorescent substance between the photo-sensor and the transparent substrate.

(9) A pad device can be realized by connecting a semiconductor integrated circuit for processing signals with the image sensor device through a connection electrode used for connecting an external circuit.

What is claimed is:

1. A solid state image sensor device comprising:
a semiconductor substrate;
a photo-sensor formed on a surface of the semiconductor substrate receptive of an electromagnetic wave irradiated from outside of the device;
an electrode formed on a surface of the photo-sensor receptive of the electromagnetic wave and extending along a surface of the semiconductor substrate receptive of the electromagnetic wave; and
an aperture formed on a surface which is opposite to the surface of the semiconductor substrate receptive of the electromagnetic wave so as to expose a part of a surface of the electrode which is not receptive of the electromagnetic wave and to connect the electrode to the surface which is opposite to the surface of the semiconductor substrate receptive of the electromagnetic wave to effect an electrical connection with an external circuit.

2. A solid state image sensor according to claim 1, wherein a part of a surface of the electrode which is not receptive of the electromagnetic wave is connected to a bump electrode for connection to an external circuit through the bump electrode.

3. A solid state image sensor according to claim 1, further comprising an adhesive disposed above the surface of the semiconductor substrate receptive of the electromagnetic wave; and a second substrate disposed on the adhesive and bonded to the semiconductor substrate by the adhesive.

4. A solid state image sensor according to claim 3, wherein a part of the surface of the electrode which is not receptive of the electromagnetic wave is connected to a bump electrode for connection to an external circuit through the bump electrode.

5. A solid state image sensor according to claim 3, wherein the adhesive contains a fluorescent substance.

6. A solid state image sensor according to claim 3, wherein the adhesive is a fluorescent substance.

7. A solid state image sensor according to claim 3, further comprising a film made of a fluorescent substance interposed between the second substrate and the adhesive.

8. A solid state image sensor according to claim 3, wherein the second substrate has a lens located in a position corresponding to a position of the photo-sensor.

9. A solid state image sensor according to claim 3, wherein the second substrate has an optical fiber located in a position corresponding to a position of the photo-sensor.

10. A solid state image sensor device comprising:
a semiconductor substrate;
a photo-sensor formed on a surface of the semiconductor substrate receptive of an electromagnetic wave irradiated from outside of the device;
a first electrode formed on a surface of the photo-sensor receptive of the electromagnetic wave and extending along the surface of the semiconductor substrate receptive of the electromagnetic wave; and a connection electrode formed on a surface of the semiconductor substrate which is opposite to the surface of the semiconductor substrate receptive of the electromagnetic wave, the connection electrode being electrically coupled with a part of the first electrode through the semiconductor substrate, and the connection electrode being connected to a bump electrode for connection to an external circuit through the bump electrode.

11. A solid state image sensor according to claim 10, further comprising an adhesive disposed above the surface of the semiconductor substrate receptive of the electromagnetic wave; and a second substrate disposed on the adhesive and bonded to the semiconductor substrate by the adhesive.

12. A solid state image sensor according to claim 11, wherein the adhesive contains a fluorescent substance.

13. A solid state image sensor according to claim 11, wherein the adhesive is a fluorescent substance.

14. A solid state image sensor according to claim 11, further comprising a film made of a fluorescent substance interposed between the second substrate and the adhesive.

15. A solid state image sensor device comprising:
a semiconductor substrate;
a photo-sensor formed on a surface of the semiconductor substrate receptive of an electromagnetic wave irradiated from outside of the device;
a first electrode formed on a surface of the photo-sensor receptive of the electromagnetic wave and extending along the surface of the semiconductor substrate receptive of the electromagnetic wave;
a connection electrode formed on a surface which is opposite to the surface of the semiconductor substrate receptive of the electromagnetic wave, the connection electrode being electrically connected to a part of the first electrode through the semiconductor substrate;
an adhesive disposed above the surface of the semiconductor substrate receptive of the electromagnetic wave; and
a second substrate disposed on the adhesive and bonded to the semiconductor substrate by the adhesive, the second substrate having a lens located in a position corresponding to a position of the photo-sensor.

16. A solid state image sensor device comprising:
a semiconductor substrate;
a photo-sensor formed on a surface of the semiconductor substrate receptive of an electromagnetic wave irradiated from outside of the device;
a first electrode formed on a surface of the photo-sensor receptive of the electromagnetic wave and extending along the surface of the semiconductor substrate receptive of the electromagnetic wave;
a connection electrode formed on a surface which is opposite to the surface of the semiconductor substrate receptive of the electromagnetic wave, the connection electrode being electrically connected to a part of the first electrode through the semiconductor substrate;
an adhesive disposed above the surface of the semiconductor substrate receptive of the electromagnetic wave; and
a second substrate disposed on the adhesive and bonded to the semiconductor substrate by the adhesive, the second substrate having an optical fiber located in a position corresponding to a position of the photo-sensor.

17. A solid state image sensor device comprising:
a semiconductor substrate;
a photo-sensor formed on a surface of the semiconductor substrate receptive of an electromagnetic wave irradiated from outside of the device;
a first electrode formed on a surface of the photo-sensor receptive of the electromagnetic wave and extending along the surface of the semiconductor substrate receptive of the electromagnetic wave;
a first circuit formed on the surface of the semiconductor substrate receptive of the electromagnetic wave irradiated from the outside of the device, the first circuit being electrically connected to the first electrode;
a second electrode formed on the surface of the semiconductor substrate receptive of the electromagnetic wave irradiated from the outside of the device, the second electrode being electrically connected to the first circuit and coupled with the first electrode through the first circuit;
a second circuit formed on the surface of the semiconductor substrate receptive of the electromagnetic wave irradiated from the outside of the device, the second circuit being electrically connected to the second electrode;
a third electrode formed on the surface of the semiconductor substrate receptive of the electromagnetic wave irradiated from the outside of the device, the third electrode being electrically connected to the second circuit and coupled with the second electrode through the second circuit; and
a connection electrode formed on a surface of the semiconductor substrate which is opposite to the surface of the semiconductor substrate receptive of the electromagnetic wave, the connection electrode being electrically coupled with a part of the third electrode through the semiconductor substrate.

18. A solid state image sensor according to claim 17, wherein the connection electrode is connected to a bump electrode for connecting to an external circuit through the bump electrode.

19. A solid state image sensor according to claim 17, further comprising an adhesive disposed above the surface of the semiconductor substrate receptive of the electromagnetic wave; and a second substrate disposed on the adhesive and bonded to the semiconductor substrate by the adhesive.

20. A solid state image sensor according to claim 19, wherein the connection electrode is connected to a bump electrode for connecting to an external circuit through the bump electrode.

21. A solid state image sensor according to claim 17, wherein the adhesive contains a fluorescent substance.

22. A solid state image sensor according to claim 17, wherein the adhesive is a fluorescent substance.

23. A solid state image sensor according to claim 17, further comprising a film made of a fluorescent substance interposed between the second substrate and the adhesive.

24. A solid state image sensor according to claim 17, wherein the second substrate has a lens located in a position corresponding to a position of the photo-sensor.

25. A solid state image sensor according to claim 17, wherein the second substrate has an optical fiber located in a position corresponding to a position of the photo-sensor.

26. A solid state image sensor device comprising:
a semiconductor substrate;
a photo-sensor formed on a surface of the semiconductor substrate receptive of an electromagnetic wave irradiated from outside of the device;
a first electrode formed on a surface of the photo-sensor receptive of the electromagnetic wave and extending along the surface of the semiconductor substrate receptive of the electromagnetic wave;
a second electrode formed on a surface of the semiconductor substrate which is opposite to the surface of the semiconductor substrate receptive of the electromagnetic wave irradiated from the outside of the device, the second electrode being electrically coupled with a part of the first electrode through the semiconductor substrate;
a first circuit formed on the surface of the semiconductor substrate which is opposite to the surface of the semiconductor substrate receptive of the electromagnetic wave irradiated from the outside of the device, the first circuit being electrically connected to the second electrode;
a third electrode formed on the surface of the semiconductor substrate which is opposite to the semiconductor substrate receptive of the electromagnetic wave irradiated from the outside of the device, the third electrode being electrically connected to the first circuit and coupled with the second electrode through the first circuit;
a second circuit formed on the surface of the semiconductor substrate which is opposite to the surface of the semiconductor substrate receptive of the electromagnetic wave irradiated from the outside of the device, the second circuit being electrically connected to the third electrode;
a fourth electrode formed on the surface of the semiconductor substrate which is opposite to the surface of the semiconductor substrate receptive of the electromagnetic wave irradiated from the outside of the device, the fourth electrode being electrically connected to the second circuit and coupled with the third electrode through the second circuit; and
a connection electrode formed on the surface of the semiconductor substrate which is opposite to the surface of the semiconductor substrate receptive of the electromagnetic wave, the connection electrode being electrically connected to a part of the fourth electrode.

27. A solid state image sensor according to claim 26, wherein the connection electrode is connected to a bump electrode for connecting to an external circuit through the bump electrode.

28. A solid state image sensor according to claim 26, further comprising an adhesive disposed above the surface of the semiconductor substrate receptive of the electromagnetic wave; and a second substrate disposed on the adhesive and bonded to the semiconductor substrate by the adhesive.

29. A solid state image sensor according to claim 28, wherein the connection electrode is connected to a bump electrode for connecting to an external circuit through the bump electrode.

30. A solid state image sensor according to claim 26, wherein the adhesive contains a fluorescent substance.

31. A solid state image sensor according to claim 26, wherein the adhesive is a fluorescent substance.

32. A solid state image sensor according to claim 26, further comprising a film made of a fluorescent substance interposed between the second substrate and the adhesive.

33. A solid state image sensor according to claim 26, wherein the second substrate has a lens located in a position corresponding to a position of the photo-sensor.

34. A solid state image sensor according to claim 26, wherein the second substrate has an optical fiber located in a position corresponding to a position of the photo-sensor.

* * * * *